United States Patent
Shigemori et al.

(10) Patent No.: US 6,645,880 B1
(45) Date of Patent: Nov. 11, 2003

(54) TREATING SOLUTION APPLYING METHOD

(75) Inventors: Kazuhito Shigemori, Kamikyo-ku (JP); Masakazu Sanada, Kamikyo-ku (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/335,302

(22) Filed: Dec. 31, 2002

(30) Foreign Application Priority Data

| Jun. 10, 2002 | (JP) | 2002-167993 |
| Jun. 10, 2002 | (JP) | 2002-167994 |
| Nov. 18, 2002 | (JP) | 2002-333157 |

(51) Int. Cl.[7] ............... H01L 21/31; H01L 21/469
(52) U.S. Cl. ............... 438/780; 438/778; 427/240
(58) Field of Search ............... 438/778, 780; 427/240

(56) References Cited

U.S. PATENT DOCUMENTS

| 5,094,884 | A | * | 3/1992 | Hillman et al. | 427/240 |
| 5,843,527 | A | * | 12/1998 | Sanada | 427/240 |
| 5,885,661 | A | * | 3/1999 | Batchelder | 427/245 |
| 5,912,049 | A | * | 6/1999 | Shirley | 427/240 |
| 5,989,632 | A | * | 11/1999 | Sanada et al. | 427/240 |
| 6,191,053 | B1 | * | 2/2001 | Chun et al. | 438/780 |
| 6,436,851 | B1 | * | 8/2002 | Young et al. | 438/782 |
| 6,548,110 | B1 | * | 4/2003 | Shirley | 427/240 |
| 2002/0127878 | A1 | * | 9/2002 | Young et al. | 438/782 |
| 2003/0044530 | A1 | * | 3/2003 | Morikawa et al. | 427/240 |

* cited by examiner

Primary Examiner—Alexander Ghyka
(74) Attorney, Agent, or Firm—Ostrolenk, Faber, Gerb & Soffen, LLP

(57) ABSTRACT

A substrate spinning step is executed for spinning a substrate in a plane parallel to a principal plane thereof at a first spinning speed of 100 rpm to 500 rpm. Then, a first applying step is executed for supplying a treating solution to a surface of the substrate by moving a nozzle from a position opposed to an edge of the substrate in a spin toward a position opposed to a spin center of the substrate while delivering the treating solution from the nozzle. Next, a second applying step is executed for supplying the treating solution to the surface of the substrate by stopping the nozzle at the position opposed to the spin center of the substrate in the spin while delivering the treating solution from the nozzle. Finally, a film thickness adjusting step is executed for stopping delivery of the treating solution from the nozzle, and spinning the substrate in the plane parallel to the principal plane thereof at a second spinning speed faster than the first spinning speed.

18 Claims, 20 Drawing Sheets

F I G. 3
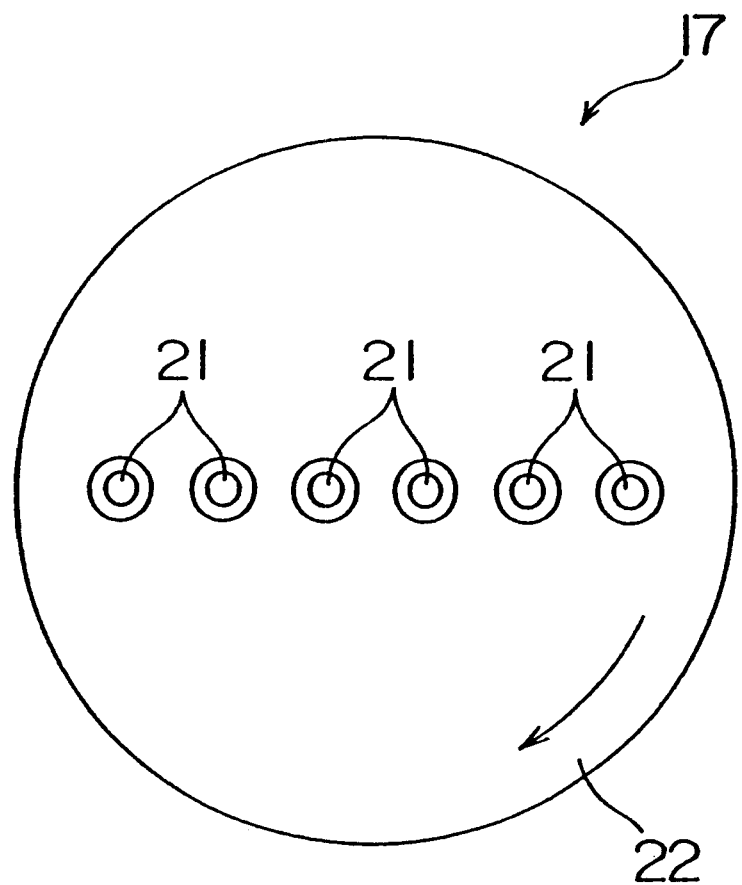

F I G. 6
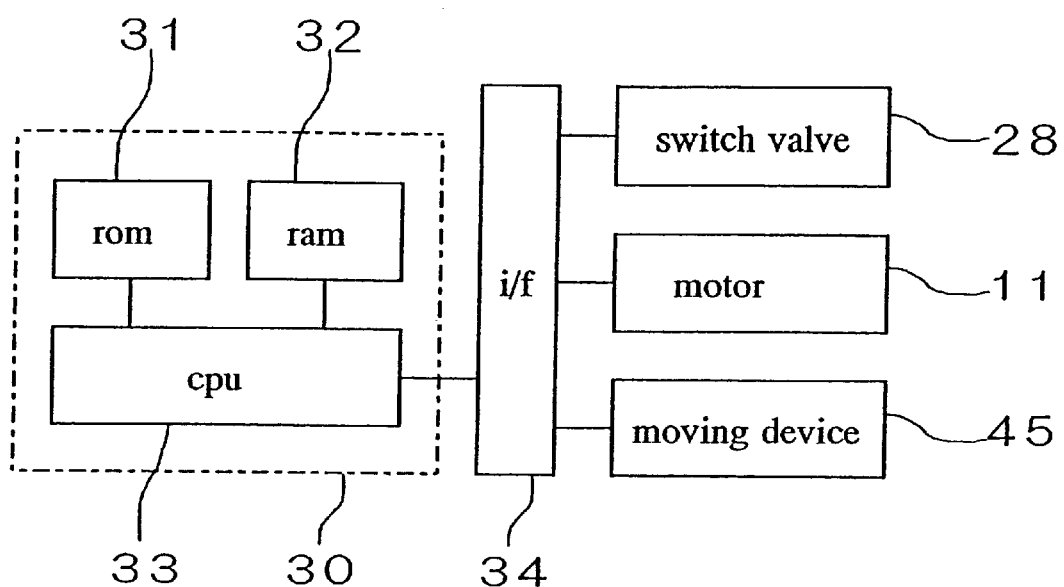

F I G. 1 3
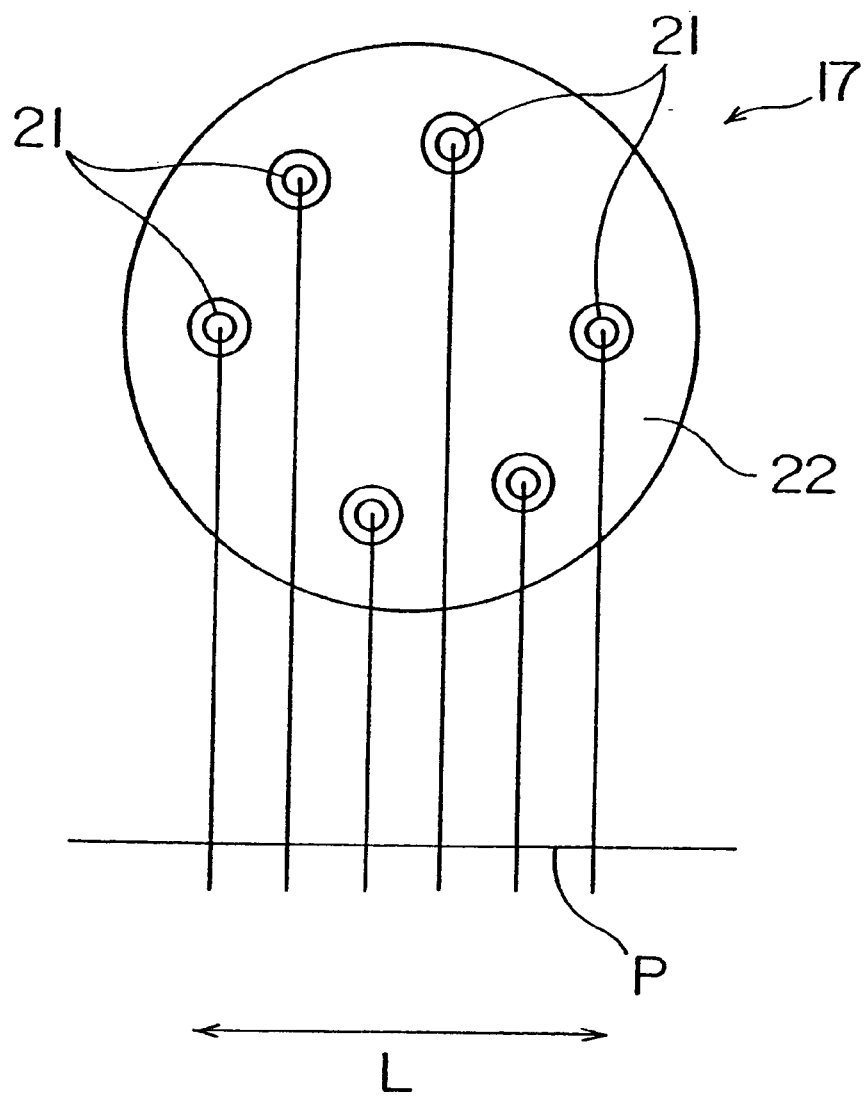

F I G. 1 4
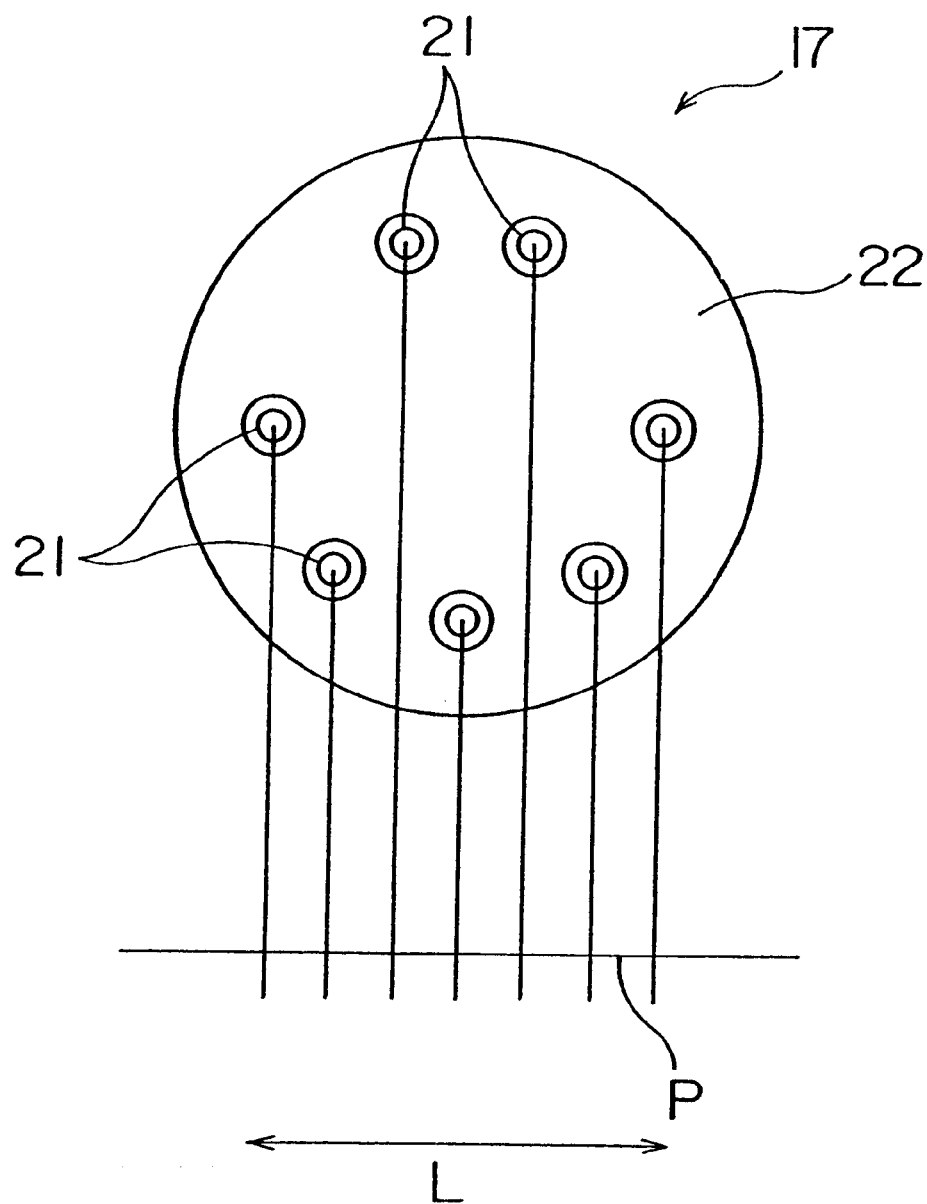

F I G. 1 5
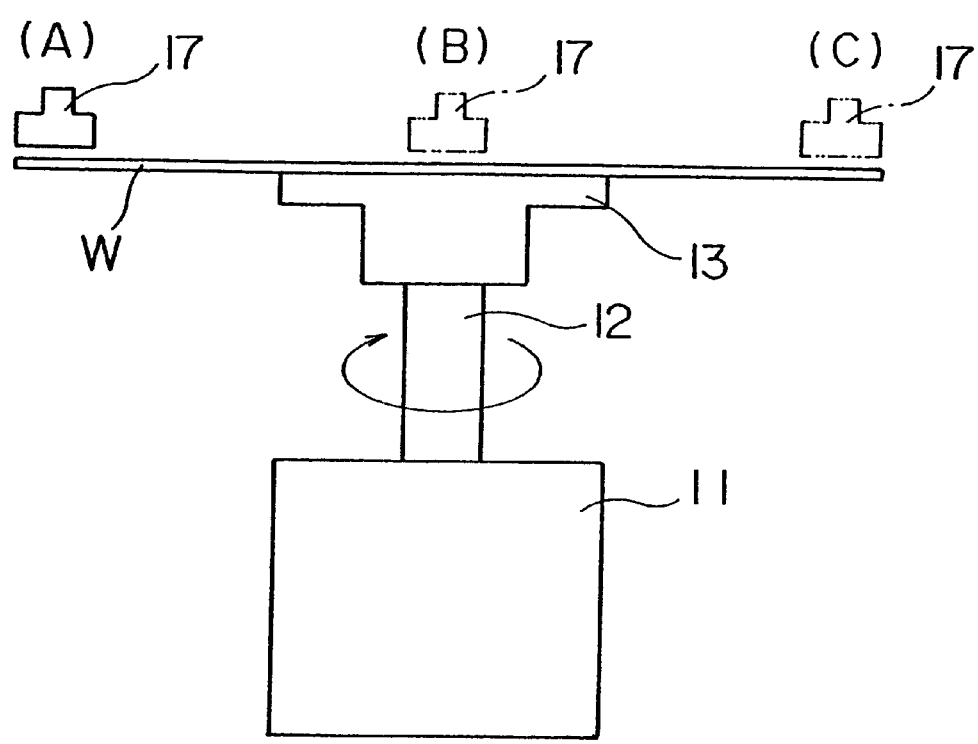

TREATING SOLUTION APPLYING METHOD

BACKGROUND OF THE INVENTION

1. Field of the Invention

This invention relates to a treating solution applying method for applying a treating solution such as resist to surfaces of substrates such as semiconductor wafers.

2. Description of the Related Art

In a conventional method of applying a treating solution such as resist to a surface of a substrate, the treating solution is supplied adjacent the center of the substrate spinning at high speed in a plane parallel to a principal plane thereof. The treating solution supplied is spread by centrifugal force to cover the entire surface of the substrate. This method, called a spin coating method, has a drawback of consuming a large quantity of resist by the time the entire surface of the substrate is covered by the resist.

Under the circumstances, a different method has been proposed for applying a treating solution over the entire surface of a substrate. In this method, while spinning the substrate, a nozzle that delivers the treating solution from the tip thereof is moved between a position having the tip opposed to the spin center of the substrate and a position having the tip opposed to an edge of the substrate. Such applying method is disclosed in Japanese Patent Publications (Unexamined) Nos. 2000-350955 and 2001-113217, and U.S. Pat. Nos. 6,191,053, 5,094,884 and 5,885,661, for example.

FIG. 20 is an enlarged fragmentary sectional view showing a treating solution 101, 102 applied to a wafer W.

Depending on surface conditions of wafer W, the wafer surface may have poor wettability with resist. Consequently, in the conventional treating solution applying method noted above, repulsion of the resist or treating solution on the surface of wafer W adjacent the spin center and other locations causes an omission or unevenness of the treating solution 101, resulting in voids 103 and 104 as shown in FIG. 20. An additional application of the treating solution in a large quantity as indicated by numeral 102 in FIG. 20 has a certain effect with respect to the omission or unevenness of the treating solution. However, this measure gives rise to a different problem of requiring an excessive quantity of the coating solution.

In a further method proposed heretofore for applying a treating solution to the surface of wafer W, delivery of the treating solution to the surface of wafer W is stopped once and then the wafer W is spun again. This step spreads the treating solution from the center of wafer W radially toward the edges of wafer W, thereby uniforming the thickness of the treating solution over the surface of wafer W. According to this method, even when an omission or unevenness of the solution takes place adjacent the edges of wafer W, the spin of wafer W causes a surplus part of the treating solution present adjacent the center of wafer W to spread radially toward the edges of wafer W. This produces some effect without increasing the overall quantity of the treating solution. However, when voids 104 are caused by omission or unevenness of the solution adjacent the center of wafer W, the spin of wafer W cannot eliminate the omission or unevenness of the solution since there is nothing to compensate for the shortage of the solution adjacent the center of wafer W.

In the conventional treating solution applying methods described above, the omission or unevenness of the solution adjacent the spin center of the substrate is caused also by a discrepancy in the timing of delivery of the treating solution from the nozzle and movement of the nozzle.

SUMMARY OF THE INVENTION

The object of this invention, therefore, is to provide a treating solution applying method for applying a treating solution uniformly over the entire surface of a substrate without requiring a large quantity of treating solution.

The above object is fulfilled, according to this invention, by a treating solution applying method comprising a substrate spinning step for spinning a substrate in a plane parallel to a principal plane thereof at a first spinning speed of 100 rpm to 500 rpm, a first applying step for supplying a treating solution to a surface of the substrate by moving a nozzle from a position opposed to an edge of the substrate in a spin toward a position opposed to a spin center of the substrate while delivering the treating solution from the nozzle, a second applying step for supplying the treating solution to the surface of the substrate by stopping the nozzle at the position opposed to the spin center of the substrate in the spin while delivering the treating solution from the nozzle, and a film thickness adjusting step for stopping delivery of the treating solution from the nozzle, and spinning the substrate in the plane parallel to the principal plane thereof at a second spinning speed faster than the first spinning speed.

With this treating solution applying method, the treating solution such as resist may be applied uniformly over the entire surface of the substrate without requiring a large quantity of the solution.

In a preferred embodiment of the invention, the second spinning speed is 1,000 rpm to 3,500 rpm.

In another aspect of the invention, a treating solution applying method comprises a substrate spinning step for spinning a substrate in a plane parallel to a principal plane thereof at a first spinning speed, a first applying step for supplying a treating solution to a surface of the substrate by moving a nozzle from a position opposed to an edge of the substrate in a spin toward a position opposed to a spin center of the substrate while delivering the treating solution from the nozzle, a second applying step for supplying the treating solution to the surface of the substrate by stopping the nozzle at the position opposed to the spin center of the substrate in the spin while delivering the treating solution from the nozzle, a third applying step for supplying the treating solution to the surface of the substrate by moving the nozzle from the position opposed to the spin center of the substrate in the spin toward a position opposed to an edge of the substrate while delivering the treating solution from the nozzle, and a film thickness adjusting step for stopping delivery of the treating solution from the nozzle, and spinning the substrate in the plane parallel to the principal plane thereof at a second spinning speed faster than the first spinning speed.

In the second applying step, the substrate, preferably, is spun at a third spinning speed, e.g. 100 rpm to 300 rpm, slower than the first spinning speed.

Other features and advantages of the invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 3 is a bottom view of a nozzle;

FIG. 6 is a block diagram showing a main electrical construction of the treating solution applying apparatus;

FIG. 13 is an explanatory view showing a still further modified arrangement of treating solution outlets on the nozzle;

FIG. 14 is an explanatory view showing a still further modified arrangement of treating solution outlets on the nozzle;

FIG. 15 is a side view schematically showing a treating solution applying apparatus for implementing the invention;

DESCRIPTION OF THE PREFERRED EMBODIMENTS

Figure 1:
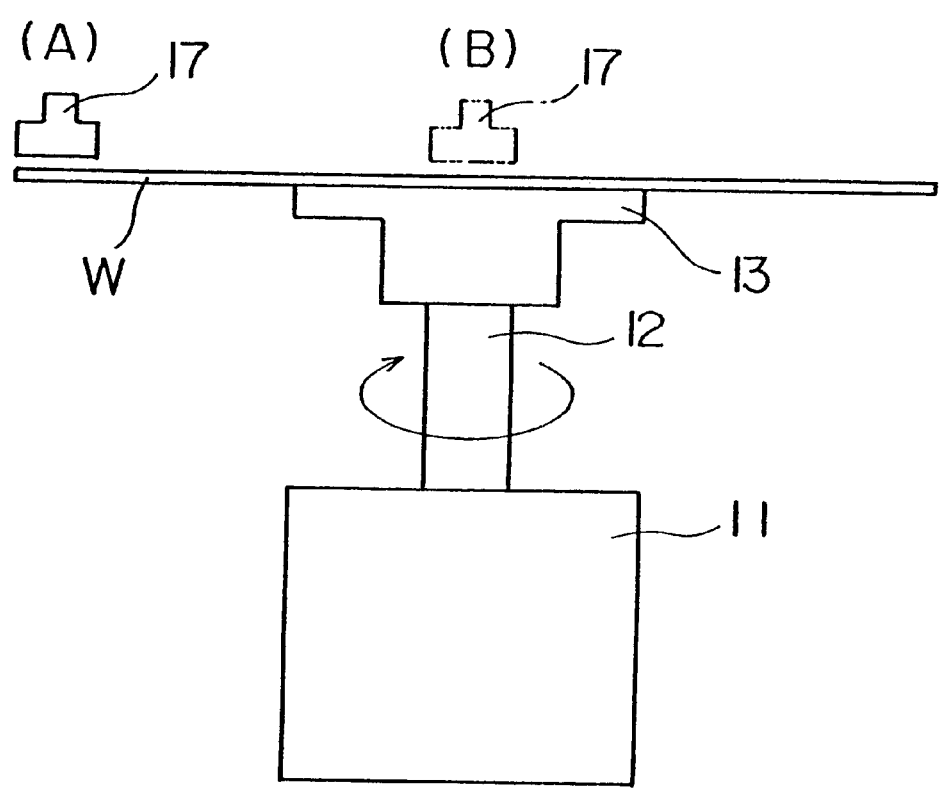
FIG. 1 is a side view schematically showing a treating solution applying apparatus for implementing the invention.
Figure 2:
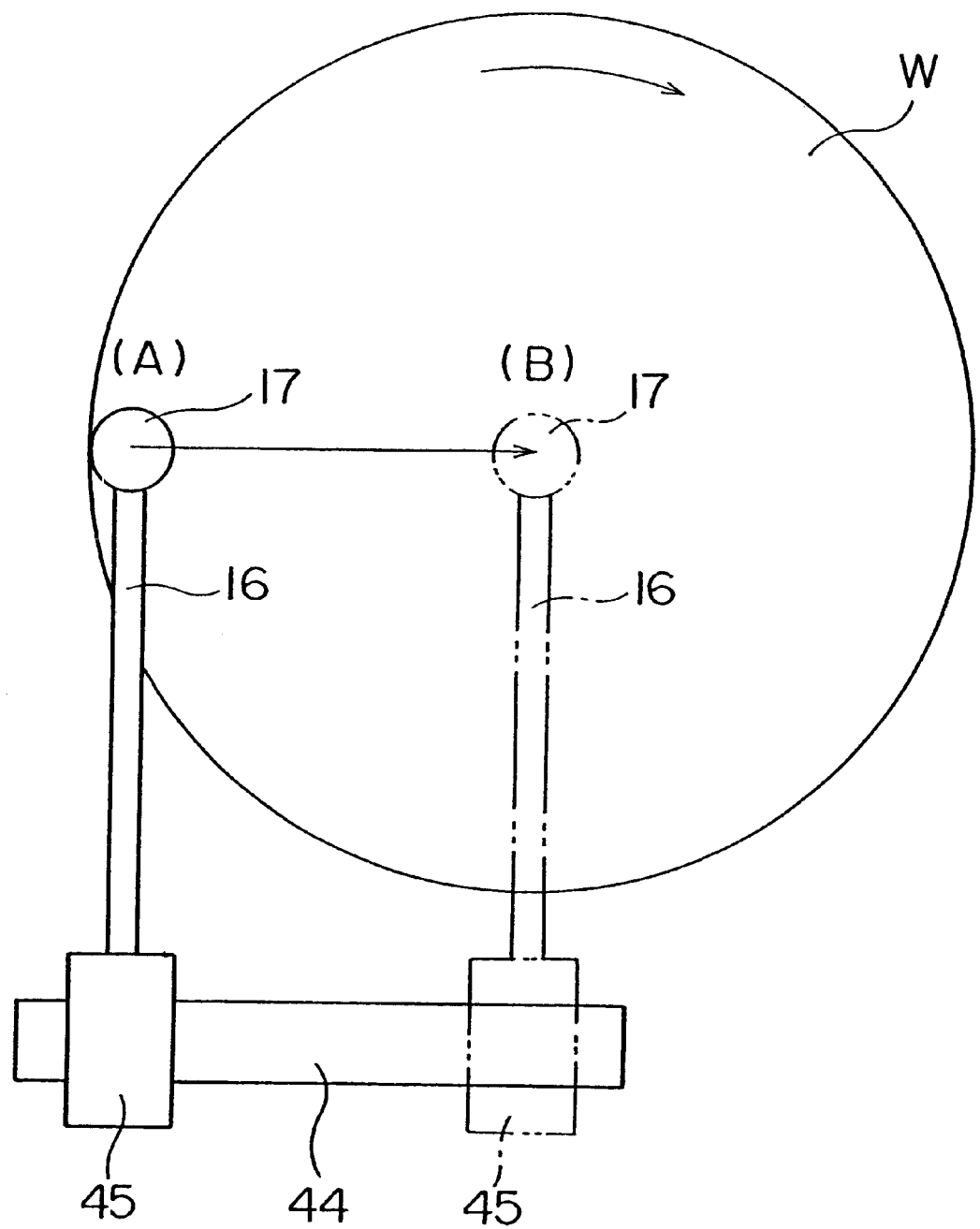
FIG. 2 is a plan view schematically showing the treating solution applying apparatus.

An embodiment of this invention will be described hereinafter with reference to the drawings. FIG. 1 is a side view schematically showing a treating solution applying apparatus for implementing this invention. FIG. 2 is a plan view of the apparatus.

This treating solution applying apparatus includes a spin chuck 13 for supporting a wafer W at a back surface thereof by suction. The spin chuck 13 is connected to a motor 11 through a shaft 12. Thus, the motor 11 is operable to cause the wafer W suction-supported by the spin chuck 13 to spin in a plane parallel to a principal plane of the wafer W.

The treating solution applying apparatus includes a nozzle 17 for supplying resist as a treating solution to the surface of wafer W. The nozzle 17 is connected to an arm 16. The arm 16 is supported by a moving device 45 having a built-in moving mechanism for moving along a guide rail 44. Thus, the nozzle 17 is driven by the moving device 45 to move horizontally parallel to the principal plane of wafer W between a position opposed to an edge of spinning wafer W, marked, (A) in FIGS. 1 and 2, and a position opposed to the spin center of spinning wafer W, marked (B) in FIGS. 1 and 2.

Figure 4:
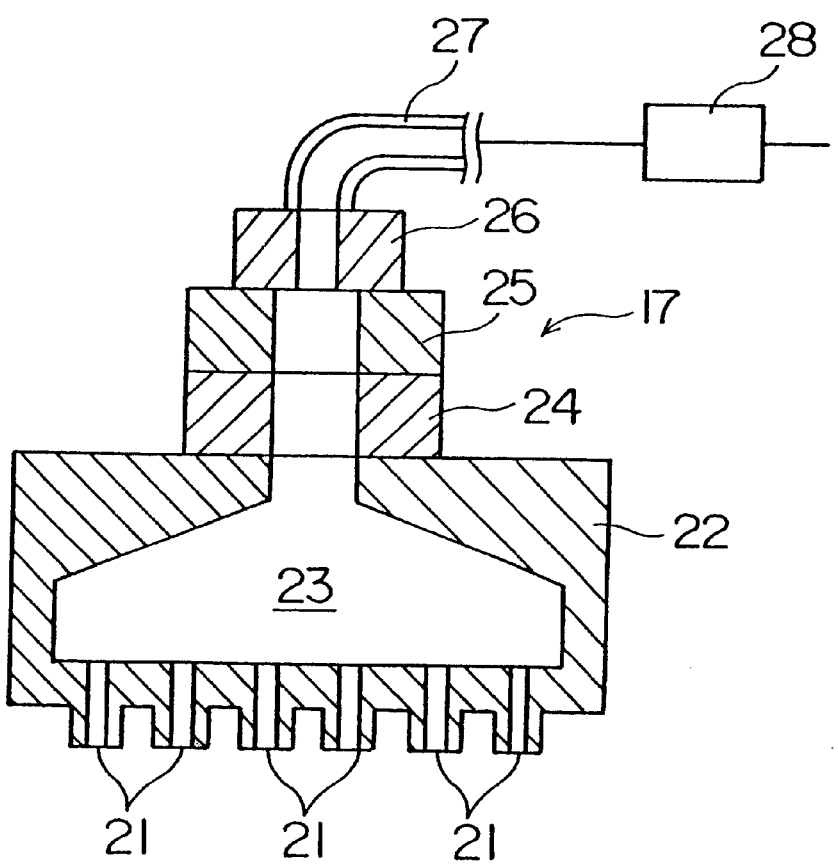
FIG. 4 is a sectional view of the nozzle.

FIG. 3 is a bottom view of the nozzle 17. FIG. 4 is a sectional view of the nozzle 17.

The nozzle 17 includes a body 22 defining a hollow interior space 23. This hollow space 22 is connected to a treating solution supply pipe 27 through channels formed in a pair of angle-of-rotation adjusting members 24 and 25 and a fixed member 26. The supply pipe 27 is connected to a treating solution source, not shown, through a switch valve 28.

The body 22 of nozzle 17 has six treating solution outlets 21 arranged at fixed intervals on a bottom surface thereof. Each treating solution outlet 21 has a discharge opening connected to the hollow space 23 in the body 22. The body 22 is adjustable to a selected rotational position, as indicated by an arrow in FIG. 3, by the action of the pair of angle-of-rotation adjusting members 24 and 25. This enables an adjustment of the direction of arrangement of the six treating solution outlets 21 on the bottom surface of the body 22.

Figure 5:
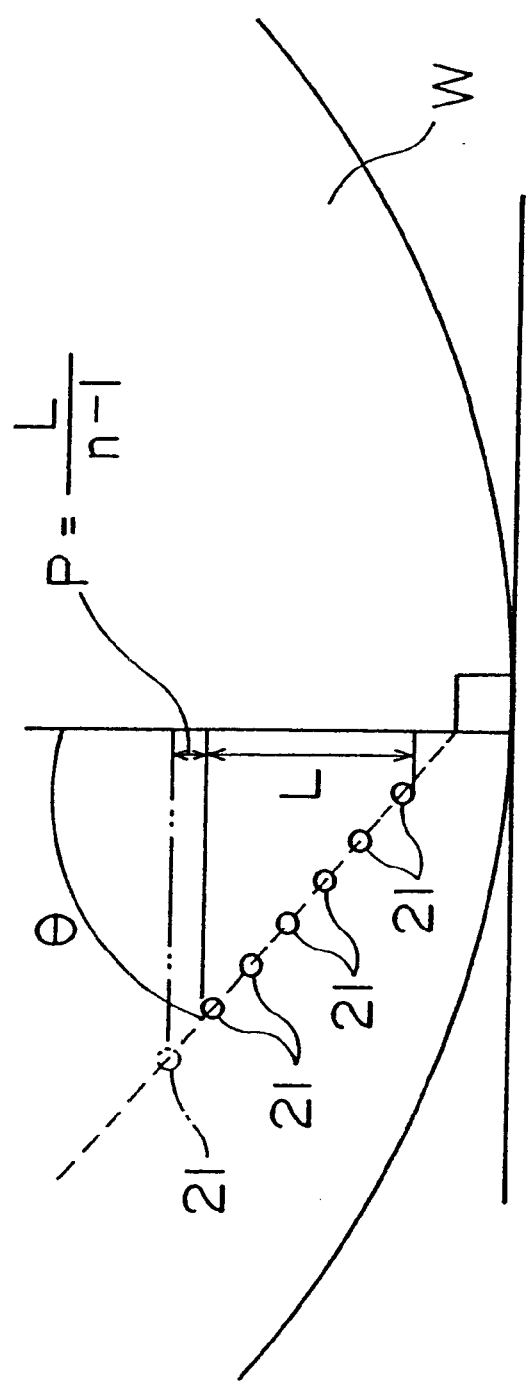
FIG. 5 is an explanatory view showing an angular arrangement of six treating solution outlets.

FIG. 5 is an explanatory view for illustrating an angular position of the direction of arrangement of the six treating solution outlets 21.

In the state shown in FIG. 5, an angle θ is formed between a normal extending at right angles to a tangent to the circumference of wafer W, i.e. a circle about the spin center of wafer W, and the direction of arrangement of the six treating solution outlets 21 (i.e. between a moving direction of nozzle 17 and the direction of arrangement of the six treating solution outlets 21). In this state, the direction of arrangement of the six treating solution outlets 21 intersects the direction tangential to the circumference of wafer W (i.e. the circle about the spin center of wafer W) at an angle of 90 degrees-θ. By the action of the above angle-of-rotation adjusting member 24, the body 22 may be turned to adjust the angle θ, thereby adjusting the angle at which the direction of arrangement of the six treating solution outlets 21 intersects the direction tangential to the circle about the spin center of wafer W.

The nozzle 17 shown in FIG. 3 has the six treating solution outlets 21 arranged at fixed intervals. Consequently, the treating solution is supplied at fixed intervals of space from the nozzle 17 to the wafer W. By supplying the treating solution at fixed intervals from the nozzle 17 to the wafer W, consumption of the treating solution may be reduced, compared with the case of supplying the treating solution without intervals of space over the entire surface of wafer W, especially near the edges of wafer W. Further, where the treating solution is supplied without intervals of space over the entire surface of wafer W, the treating solution tends to flow from overlapping parts toward the edges of wafer W under the centrifugal force produced by the spin. With the treating solution spilling from the wafer W in the applying step preceding a film thickness adjusting step to be described hereinafter, the treating solution could be consumed in an increased quantity and/or applied unevenly over the wafer W. Such inconveniences may be avoided by applying the treating solution at fixed intervals of space to the wafer W. Thus, the treating solution may be applied uniformly over the surface of wafer W, while restraining consumption of the treating solution. The treating solution supplied at fixed intervals of space is spread over the entire surface of wafer W in the film thickness adjusting step described hereinafter.

It is desirable to adjust, at this time, the intervals of the treating solution supplied to the wafer W according to viscosity of the treating solution and wettability of wafer W. For this purpose, this treating solution applying apparatus adjusts the intervals of the treating solution supplied to the wafer W by adjusting the angle at which the direction of arrangement of the six treating solution outlets 21 intersects the direction tangential to the circle about the spin center of wafer W.

FIG. 6 is a block diagram showing a main electrical construction of the above treating solution applying apparatus.

This treating solution applying apparatus includes a control unit 30 having a ROM 31 for storing operating programs necessary for controlling the apparatus, a RAM 32 for temporarily storing data and the like during a control operation, and a CPU 33 for performing logic operations. The control unit 30 is connected through an interface 34 to the switch valve 28, motor 11 and moving device 45 noted hereinbefore. Thus, the control unit 30 controls spinning speed of the spin chuck 13, moving speed of the arm 16, and timing of delivery of the treating solution from the nozzle 17.

Specifically, the control unit 30 controls spinning speed of the spin chuck 13 and moving speed of the moving device 45 such that, in one rotation of the wafer W supported by the spin chuck 13, as shown in FIG. 5, the nozzle 17 is moved by an amount L+P which is a sum of a length L of arrangement of the six treating solution outlets 21 on the nozzle 17 seen in the direction perpendicular to the direction tangential to the circle about the spin center of wafer W (i.e. in the direction of nozzle movement) and the interval or pitch P between each adjacent pair of outlets 21 seen in the moving direction of the nozzle 17. Where the number of treating solution outlets 21 is n, P=L/(n−1). Further, the control unit 30 controls opening and closing of the switch valve 28 according to positions of the nozzle 17 relative to the wafer W spinning with the spin chuck 13.

Figure 7:
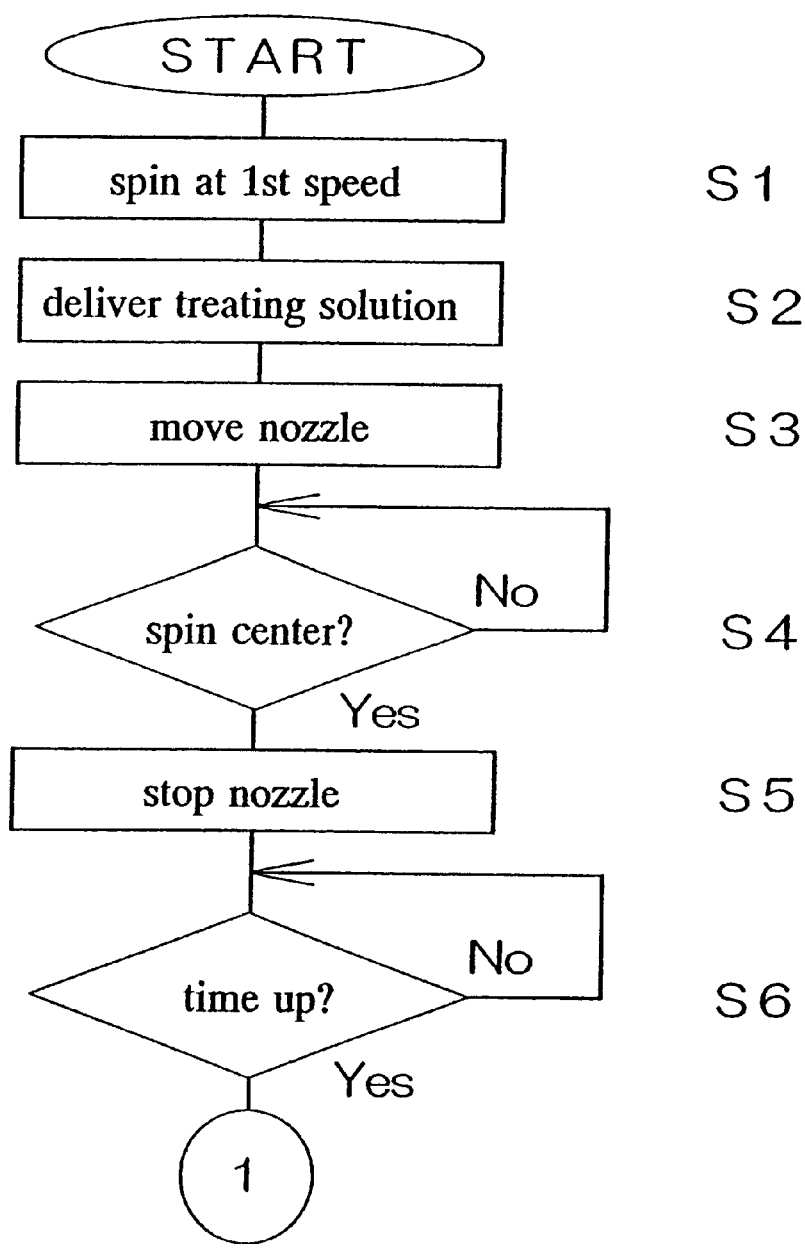
FIG. 7 is a flow chart of a treating solution applying operation.
Figure 8:
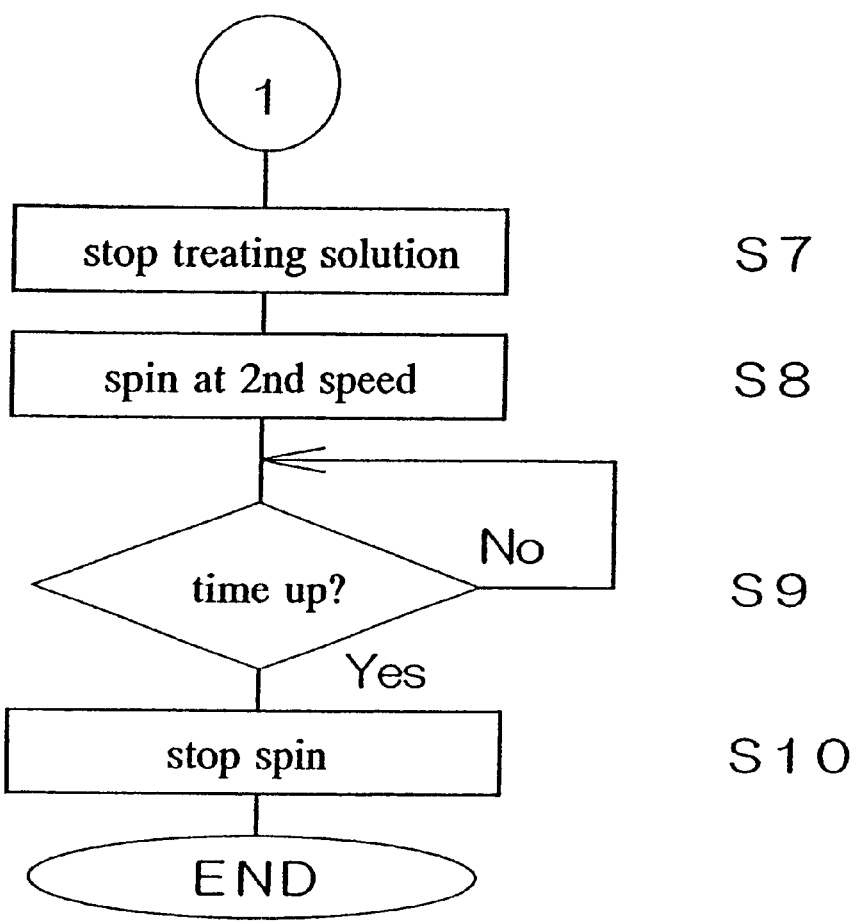
FIG. 8 is a flow chart of the treating solution applying operation.

Next, an operation for applying the treating solution to the wafer W by using the above treating solution applying apparatus will be described. FIGS. 7 and 8 are flow charts of the treating solution applying operation.

When starting the treating solution applying operation, the nozzle 17 is located in the position, marked (A) in FIGS. 1 and 2, opposed to the edge of the wafer W supported by the spin chuck 13.

In this state, the spin chuck 13 is driven to spin the wafer W at a first spinning speed in a plane parallel to the principal plane (Step S1). Preferably, the first spinning speed is in the order of 100 rpm to 500 rpm.

Then, the switch valve 28 is opened to deliver the treating solution from the nozzle 17 (Step S2), and the arm 16 is moved with the moving device 45 to move the nozzle 17 toward the spin center of wafer W (Step S3). In this state, the spinning speed of wafer W is approximately 100 rpm to 500 rpm to prevent the treating solution from scattering outwardly of the wafer W. Thus, the treating solution may be supplied properly while avoiding an excessive consumption of the treating solution and without leaving an omission or unevenness of the treating solution on the surface of wafer W.

As noted hereinbefore, the control unit 30 controls spinning speed of the spin chuck 13 and moving speed of the moving device 45 such that, in one spin of the wafer W supported by the spin chuck 13, the nozzle 17 is moved by the amount L+P which is a sum of length L of arrangement of the six treating solution outlets 21 on the nozzle 17 seen in the direction perpendicular to the direction tangential to the circle about the spin center of wafer W (i.e. in the direction of nozzle movement) and the interval or pitch P between each adjacent pair of outlets 21 seen in the moving direction of the nozzle 17 (FIG. 5). Where the number of treating solution outlets 21 is n, P=L/(n−1). This control is effective to supply the treating solution over the entire surface of wafer W while avoiding the treating solution being supplied repeatedly to the same location on the surface of wafer W. Consequently, the film thickness adjusting step to be described hereinafter may be executed without encountering a phenomenon of the treating solution having scattered from locations where the solution has been supplied repeatedly, thereby rendering it impossible to form the treating solution uniformly over areas adjacent such locations. The wafer W may be treated efficiently with a small quantity of treating solution.

When the nozzle 17 reaches the position, marked (B) in FIGS. 1 and 2, opposed to the spin center of wafer W (Step S4), the movement of nozzle 17 is stopped (Step S5). Upon lapse of about 0.1 to 1 second in this state for supplying the treating solution in a required quantity around the spin center of wafer W (Step S6), the switch valve 28 is closed to stop delivery of the treating solution from the nozzle 17 (Step S7). In this state, the required quantity of treating solution has been supplied from the nozzle 17 remaining still to areas around the spin center of wafer W liable to an uneven application of the treating solution.

It is preferable, at this time, that the nozzle 17 is positioned to have any one of the treating solution outlets 21 opposed to the spin center of wafer W. This arrangement ensures supply of the treating solution to the spin center of wafer W.

Then, the spin chuck 13 is driven to spin the wafer W at a second spinning speed in the plane parallel to the principal plane (Step S8). Preferably, the second spinning speed is in the order of 1,000 rpm to 3,500 rpm. As a result, the treating solution supplied is spread over the surface of wafer W by centrifugal force, to form a uniform film of the treating solution on the surface of wafer W.

Figure 19:
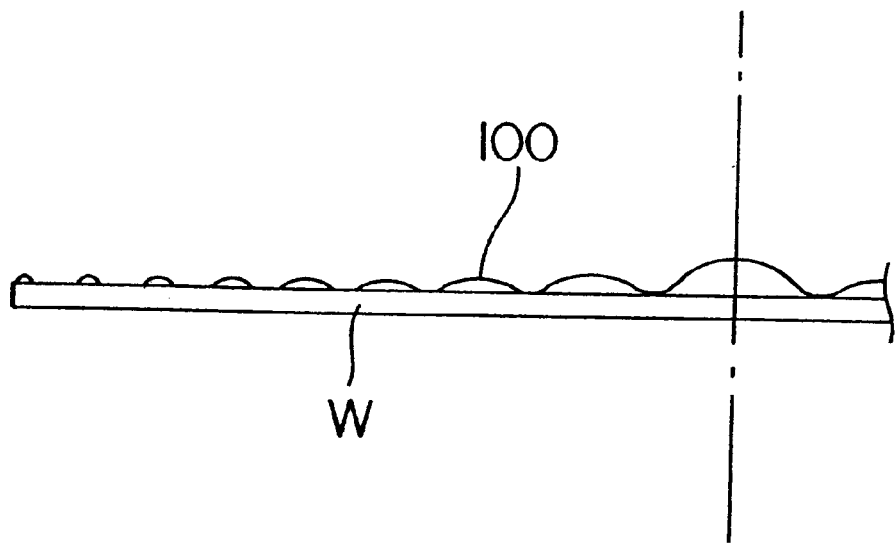
FIG. 19 is an enlarged fragmentary sectional view showing a treating solution applied to a wafer.
Figure 20:
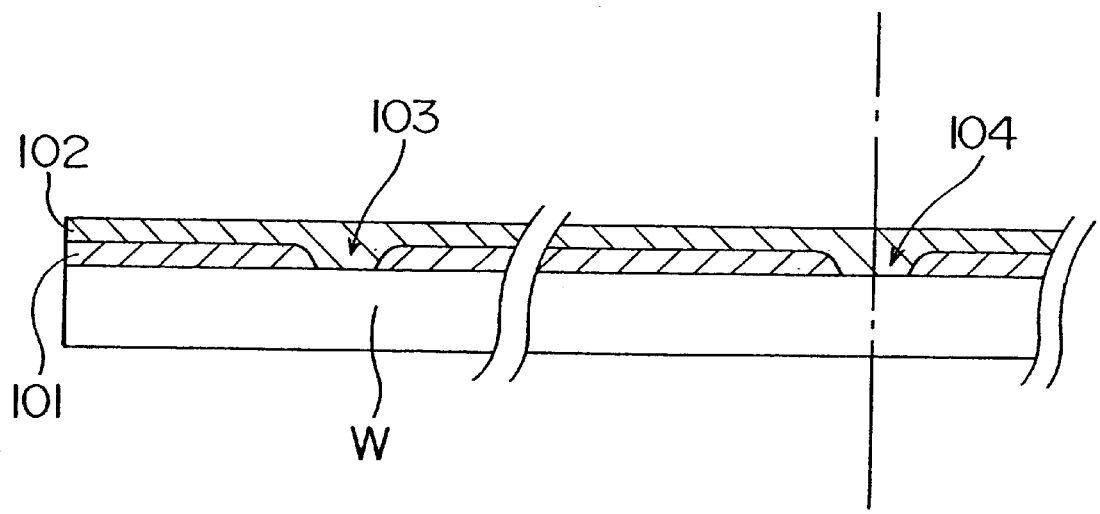
FIG. 20 is an enlarged fragmentary sectional view showing a treating solution applied to a wafer in the prior art.

FIG. 19 is an enlarged fragmentary sectional view showing conditions of treating solution 100 applied to the wafer W.

In this embodiment, as shown in FIG. 19, the treating solution is supplied in a larger quantity around the spin center than to other areas of wafer W. The treating solution is supplied at fixed intervals of space to the wafer W, which may result in certain areas on the surface of wafer W not covered by the treating solution. However, the spin of wafer W spreads the treating solution from adjacent the spin center to peripheral regions of wafer W. A uniform film may thereby be formed on the wafer surface without omission or unevenness of application, and without increasing the overall quantity of treating solution. Even when the wafer W has poor wettability and the treating solution applying step leaves an omission or unevenness of application adjacent the center of wafer W, the omission or unevenness may be eliminated in the subsequent film thickness adjusting step by using the increased supply of the treating solution to areas around the spin center of wafer W. Further, as shown in FIG. 19, the treating solution may be supplied to have its line widths gradually enlarging from edge to center of wafer W. This allows the treating solution to be spread uniformly and efficiently over the wafer surface in the subsequent thickness adjusting step.

Upon lapse of a fixed time (Step S9) with a uniform film of treating solution formed on the surface of wafer W, the spin chuck 13 is stopped spinning (Step S10) to end the treating solution applying operation.

Next, a treating solution applying apparatus in a different embodiment of this invention will be described.

Figure 9:
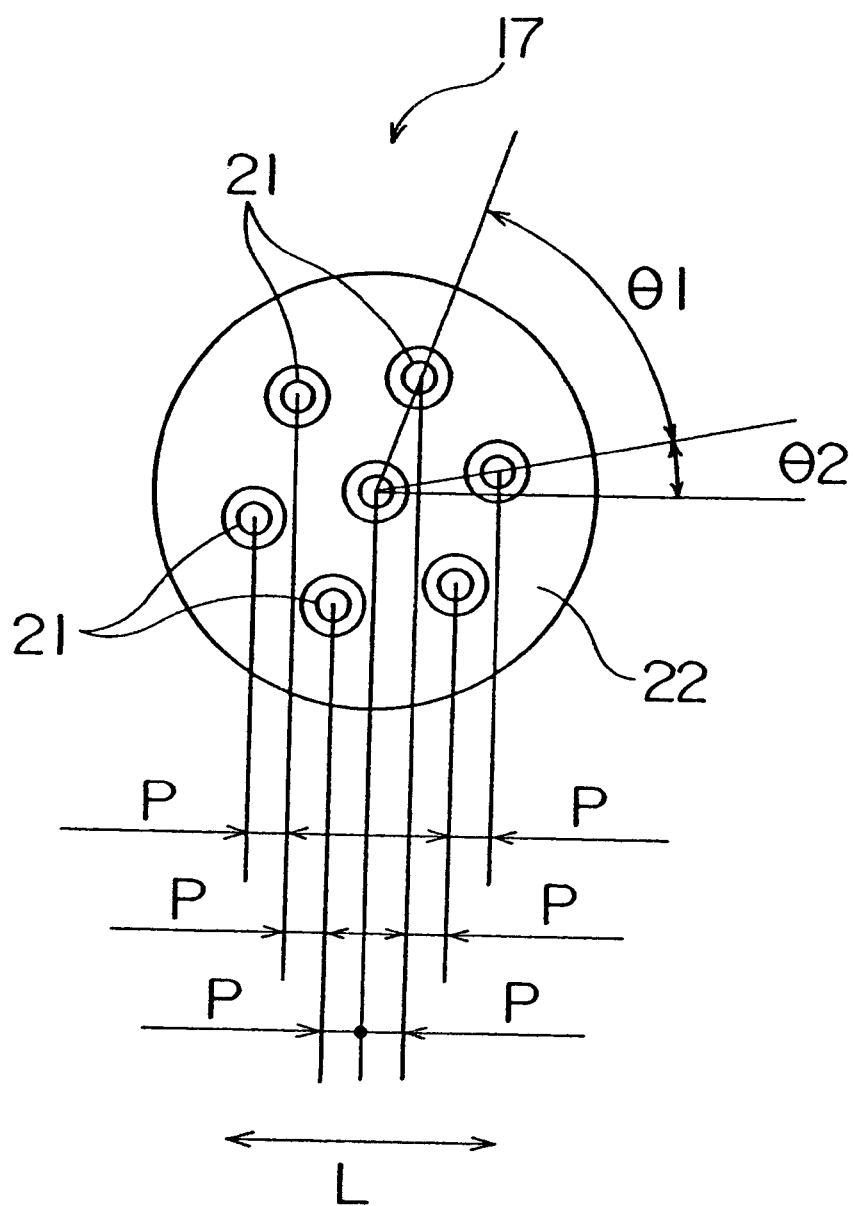
FIG. 9 is an explanatory view showing a modified arrangement of treating solution outlets on the nozzle.

The nozzle 17 of the foregoing treating solution applying apparatus, as shown in FIG. 3, has the six treating solution outlets 21 arranged at fixed intervals on the bottom surface of the body 22. As shown in FIG. 9, the treating solution applying apparatus in this embodiment includes a nozzle 17 having seven treating solution outlets 21 arranged on the bottom surface of a body 22, at vertices of a regular hexagon and at the center of a circle linking these vertices. The other aspects of the treating solution applying apparatus are the same as in the preceding embodiment, and will not particularly be described.

In the nozzle 17 of this embodiment, as shown in FIG. 9, one of the treating solution outlets 21 arranged at the vertices of a regular hexagon is located at an angle $\theta 2$ to the moving direction of the nozzle 17 (horizontal direction in FIG. 9). The treating solution outlets 21 arranged at the vertices of a hexagon are spaced from one another by 60 degrees represented by $\theta 1$ in FIG. 9.

Where the seven treating solution outlets 21 are arranged on the nozzle 17 in this way with the value of $\theta 2$ at approximately 10.89 degrees, the treating solution outlets 21 are at fixed intervals in the moving direction of the nozzle 17 (horizontal direction in FIG. 9) as referenced P in FIG. 9.

The treating solution applying apparatus having the nozzle 17 in this embodiment carries out an operation for applying the treating solution to the wafer W, also following the sequence shown in the flow charts of FIGS. 7 and 8.

Thus, when starting the treating solution applying operation, the nozzle 17 is located in the position, marked (A) in FIGS. 1 and 2, opposed to the edge of the wafer W supported by the spin chuck 13. In this state, the nozzle 17 is oriented so that the horizontal direction in FIG. 9 corresponds to the moving direction of nozzle 17. In this state, the seven treating solution outlets 21 are arranged at the fixed pitch P in the moving direction of nozzle 17. Thus, the treating solution will be supplied from this nozzle 17 at the fixed pitch to the wafer W.

In this state, the spin chuck 13 is driven to spin the wafer W at the first spinning speed in a plane parallel to the principal plane (Step S1). Preferably, the first spinning speed is in the order of 100 rpm to 500 rpm as in the preceding embodiment.

Then, the switch valve 28 is opened to deliver the treating solution from the nozzle 17 (Step S2), and the arm 16 is moved with the moving device 45 to move the nozzle 17 toward the spin center of wafer W (Step S3). In this state, the spinning speed of wafer W is approximately 100 rpm to 500 rpm to prevent the treating solution from scattering outwardly of the wafer W. Thus, the treating solution may be supplied properly while avoiding an excessive consumption of the treating solution and without leaving an omission or unevenness of the treating solution on the surface of wafer W.

As described hereinbefore, by supplying the treating solution at fixed intervals from the nozzle 17 to the wafer W, consumption of the treating solution may be reduced, compared with the case of supplying the treating solution without intervals of space over the entire surface of wafer W, especially near the edge of wafer W. Further, where the treating solution is supplied without intervals of space over the entire surface of wafer W, the treating solution tends to flow from overlapping parts toward the edges of wafer W under the centrifugal force produced by the spin. In the applying step preceding the film thickness adjusting step to be described hereinafter, the treating solution could spill from the wafer W and/or could be applied unevenly over the wafer W. Such inconveniences may be avoided by applying the treating solution at fixed intervals of space to the wafer W. Thus, the surface of wafer W may be covered uniformly with a reduced quantity of treating solution. The treating solution supplied at fixed intervals of space is spread over the entire surface of wafer W in the film thickness adjusting step described hereinafter.

The control unit 30 controls spinning speed of the spin chuck 13 and moving speed of the moving device 45 such that, in one spin of the wafer W supported by the spin chuck 13, the nozzle 17 is moved by the amount L+P which is a sum of length L of arrangement of the six outlets 21 on the nozzle 17 seen in the direction perpendicular to the direction tangential to the circle about the spin center of wafer W (i.e. in the direction of nozzle movement) and the interval or pitch P between each adjacent pair of outlets 21 seen in the moving direction of the nozzle 17 (FIG. 5). Where the number of outlets 21 is n, $P=L/(n-1)$. This control is effective to supply the treating solution over the entire surface of wafer W while avoiding the treating solution being supplied repeatedly to the same location on the surface of wafer W. Consequently, the film thickness adjusting step to be described hereinafter may be executed without encountering a phenomenon of the treating solution having scattered from locations where the solution has been supplied repeatedly, thereby rendering it impossible to form the treating solution uniformly over areas adjacent such locations. The wafer W may be treated efficiently with a small quantity of treating solution.

When the nozzle 17 reaches the position, marked (B) in FIGS. 1 and 2, opposed to the spin center of wafer W (Step S4), the movement of nozzle 17 is stopped (Step S5). Upon lapse of about 0.1 to 1 second in this state for supplying the treating solution in a required quantity around the spin center of wafer W (Step S6), the switch valve 28 is closed to stop delivery of the treating solution from the nozzle 17 (Step S7). In this state, the required quantity of treating solution has been supplied from the nozzle 17 remaining still to areas around the spin center of wafer W liable to an uneven application of the treating solution.

It is preferable, at this time, that the nozzle 17 is positioned to have any one of the treating solution outlets 21 opposed to the spin center of wafer W. This arrangement ensures supply of the treating solution to the spin center of wafer W.

It is particularly preferable n this case that the nozzle 17 is positioned to have the treating solution outlet 21 at the center (i.e. the outlet 21 disposed at the center of the circle linking the vertices of the hexagon) opposed to the spin center of wafer W. That is, where the treating solution outlets 21 are arranged linearly as in the preceding embodiment, any deviation from an integer of the number of rotations of wafer W from stopping of the movement of nozzle 17 until stopping of the delivery of the treating solution results in variations in the quantity of the treating solution supplied to areas opposed to the nozzle 17 due to differences in the angle of rotation of wafer W. Such an inconvenience may be avoided by positioning the nozzle 17 to have the treating solution outlet 21 at the center opposed to the spin center of wafer W.

Next, the spin chuck 13 is driven to spin the wafer W at the second spinning speed in the plane parallel to the principal plane (Step S8). Preferably, the second spinning speed is in the order of 1,000 rpm to 3,500 rpm as in the preceding embodiment. As a result, the treating solution supplied is spread over the surface of wafer W by centrifugal force, to form a uniform film of the treating solution on the surface of wafer W.

In this embodiment also, as shown in FIG. 19, the treating solution is supplied in a larger quantity around the spin center than to other areas of wafer W. The treating solution is supplied at fixed intervals of space to the wafer W, which may result in certain areas on the surface of wafer W not covered by the treating solution. However, the spin of wafer W spreads the treating solution from adjacent the spin center to peripheral regions of wafer W. A uniform film may thereby be formed on the wafer surface without omission or unevenness of application, and without increasing the overall quantity of treating solution. Even when the wafer W has poor wettability and the treating solution applying step leaves an omission or unevenness of application adjacent the center of wafer W, the omission or unevenness may be eliminated in the subsequent film thickness adjusting step by using the increased supply of the treating solution to areas around the spin center of wafer W. Further, as shown in FIG. 19, the treating solution may be supplied to have its line widths gradually enlarging from edge to center of wafer W. This allows the treating solution to be spread uniformly and efficiently over the wafer surface in the subsequent thickness adjusting step.

Upon lapse of the fixed time (Step S9) with a uniform film of treating solution formed on the surface of wafer W, the spin chuck 13 is stopped spinning (Step S10) to end the treating solution applying operation.

The nozzle 17 in this embodiment has the treating solution outlets 21 arranged at the vertices of a regular hexagon and at the center of a circle linking these vertices. With the angle θ2 in FIG. 9 set to approximately 10.89 degrees, the treating solution outlets 21 may be at the fixed pitch P in the moving direction of the nozzle 17 (horizontal direction in FIG. 9). However, this invention is not limited to such an arrangement.

Figure 10:
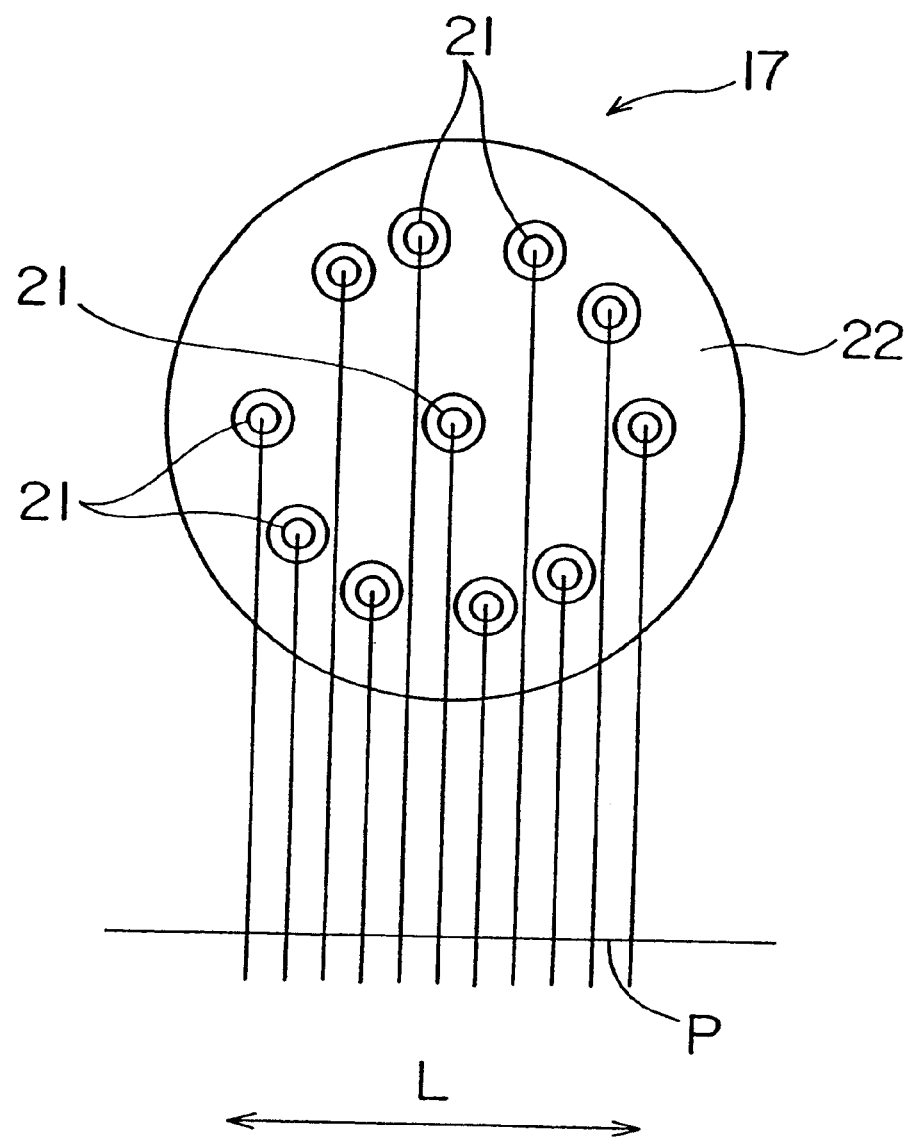
FIG. 10 is an explanatory view showing another modified arrangement of treating solution outlets on the nozzle.

The invention may employ a nozzle 17 as shown in FIG. 10, for example. This nozzle 17 has a total of 11 treating solution outlets 21 arranged at vertices of a decagon on a circle and at the center of the circle. The decagon is not a regular decagon, in order that the outlets 21 may be arranged at a constant pitch P in the moving direction of the nozzle 17 (horizontal direction in FIG. 10).

Figure 11:
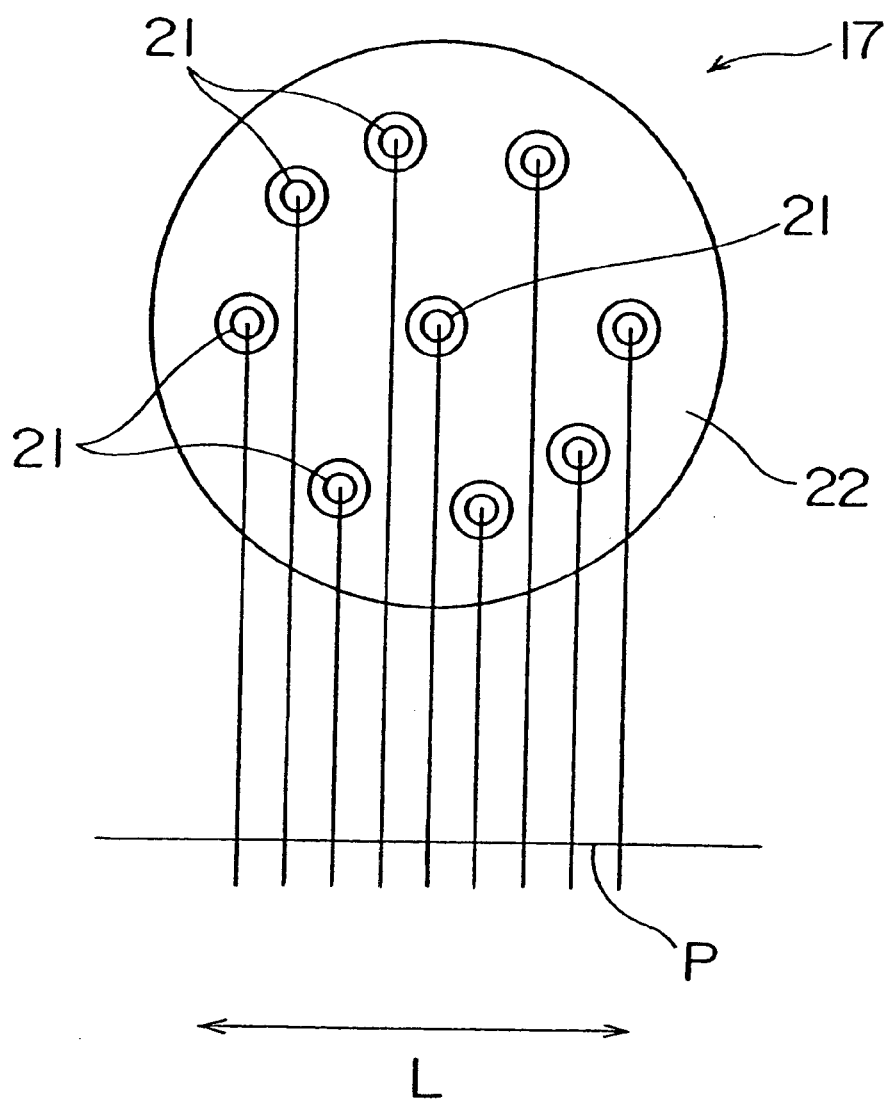
FIG. 11 is an explanatory view showing a further modified arrangement of treating solution outlets on the nozzle.

Similarly, as shown in FIG. 11, a nozzle 17 employed may have a total of nine treating solution outlets 21 arranged at vertices of an octagon on a circle and at the center of the circle. This octagon also is not a regular octagon, in order that the outlets 21 may be arranged at a constant pitch P in the moving direction of the nozzle 17 (horizontal direction in FIG. 11).

In each of the above examples, the treating solution outlets 21 are arranged at vertices of a polygon and at the center of a circle linking these vertices. However, the outlet 21 at the center of the circle linking the vertices may be omitted.

Figure 12:
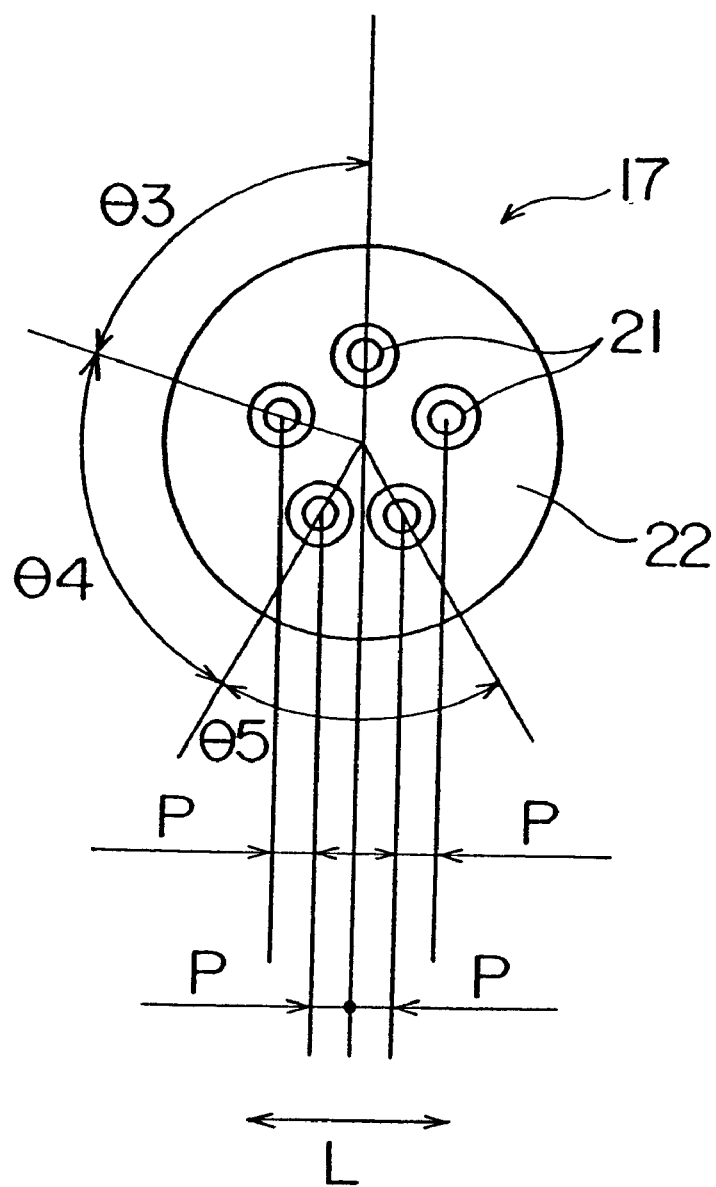
FIG. 12 is an explanatory view showing a still further modified arrangement of treating solution outlets on the nozzle.

FIG. 12 is an explanatory view showing an arrangement of treating solution outlets 21 on such a nozzle 17. The nozzle 17 of this treating solution applying apparatus has the treating solution outlets 21 arranged at vertices of a pentagon on the bottom of a body 22. These treating solution outlets 21 are arranged on a common circle. The treating solution outlets 21 are in line symmetry,.with angle θ3 shown in FIG. 12 set to 72.25 degrees, angle θ4 to 79.32 degrees and angle θ5 to 56.87 degrees. With this arrangement, the treating solution outlets 21 are at a constant pitch P in the moving direction of the nozzle 17 (horizontal direction in FIG. 12).

Similarly, as shown in FIG. 13, the treating solution outlets 21 may be arranged on vertices of a hexagon on a certain circle. As shown in FIG. 14, the outlets 21 may be arranged on vertices of a heptagon on a certain circle.

Figure 16:
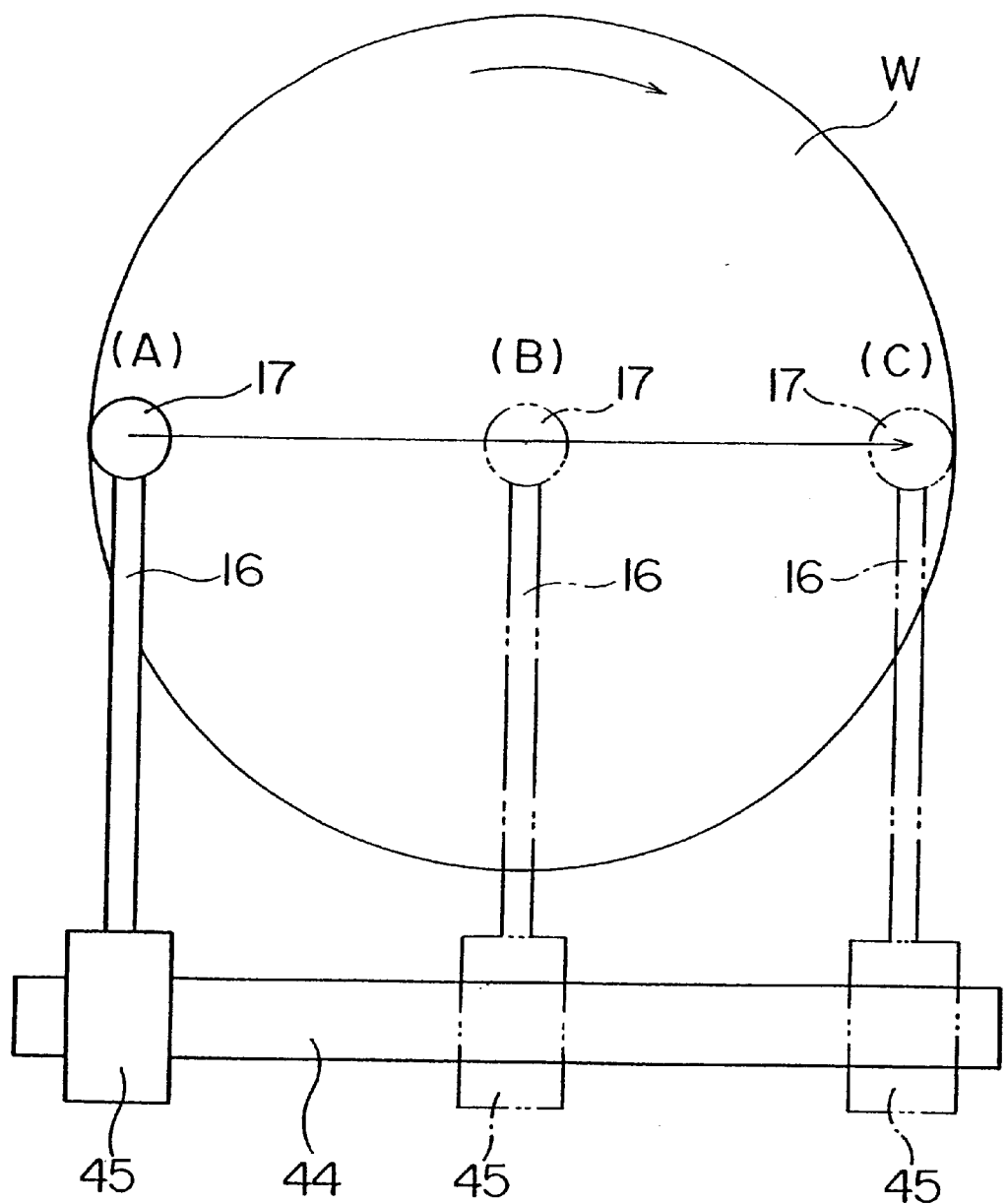
FIG. 16 is a plan view schematically showing the treating solution applying apparatus.

A treating solution applying method in a further embodiment of the invention will be described next. FIG. 15 is a side view schematically showing a treating solution applying apparatus for implementing this invention. FIG. 16 is a plan view of the apparatus.

In the preceding embodiments, the nozzle 17 is moved from the position opposed to an edge of wafer W on the spin chuck 13, marked (A) in FIGS. 1 and 2, to the position opposed to the spin center of wafer W, marked (B) in FIGS. 1 and 2. In this embodiment, the nozzle 17 is moved from a position opposed to an edge of wafer W on the spin chuck 13, marked (A) in FIGS. 15 and 16, to a position opposed to the spin center of wafer W, marked (B) in FIGS. 15 and 16, and further to a position opposed to an opposite edge of wafer W, marked (C) in FIGS. 15 and 16. The treating solution applying apparatus and the nozzle 17 used in this embodiment have the same constructions as in the preceding embodiments.

Figure 17:
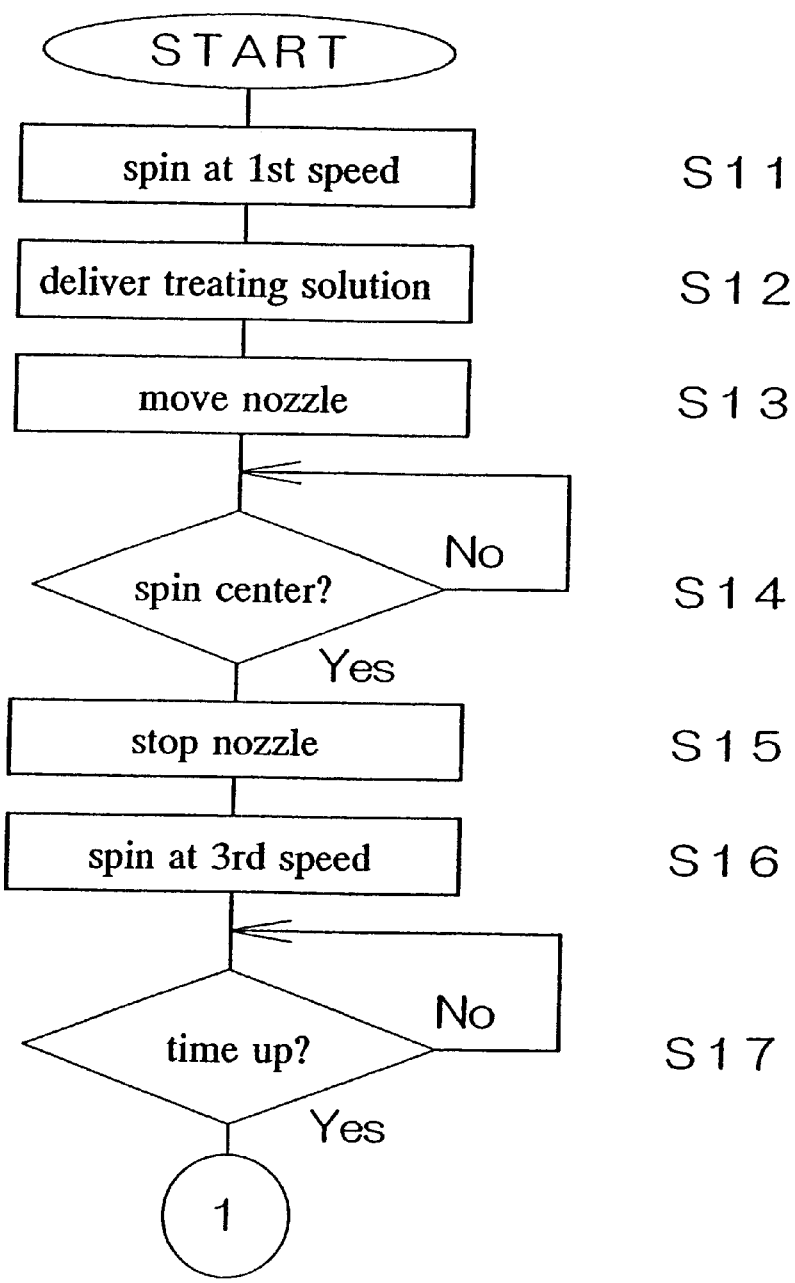
FIG. 17 is a flow chart of a treating solution applying operation.
Figure 18:
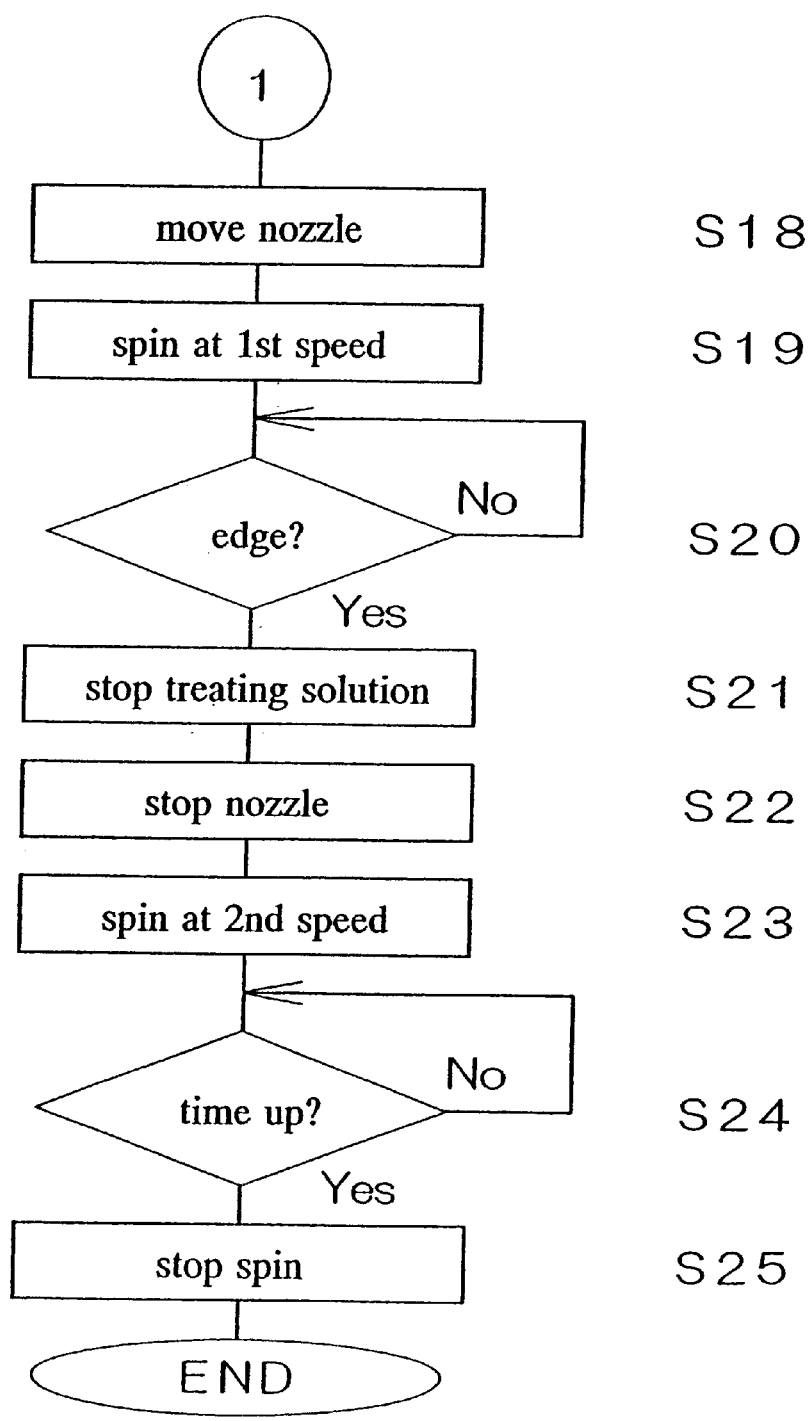
FIG. 18 is a flow chart of the treating solution applying operation.

FIGS. 17 and 18 are flow charts of a treating solution applying operation according to this embodiment.

When starting the treating solution applying operation in this embodiment, the nozzle 17 is located in the position, marked (A) in FIGS. 15 and 16, opposed to the edge of the wafer W supported by the spin chuck 13.

In this state, the spin chuck 13 is driven to spin the wafer W at a first spinning speed in a plane parallel to the principal plane (Step S11). Preferably, the first spinning speed is in the order of 100 rpm to 500 rpm.

Then, the switch valve 28 is opened to deliver the treating solution from the nozzle 17 (Step S12), and the arm 16 is moved to move the nozzle 17 toward the spin center of wafer W (Step S13). In this state, the spinning speed of wafer W is approximately 100 rpm to 500 rpm, whereby the treating solution is supplied properly without consuming a large quantity of treating solution.

When the nozzle 17 reaches the position, marked (B) in FIGS. 15 and 16, opposed to the spin center of wafer W (Step S14), the movement of nozzle 17 is stopped (Step S15) and the spin chuck 13 is driven to spin the wafer W at a third spinning speed (Step S16).

Preferably, the third spinning speed is in the order of 100 rpm to 300 rpm. In this state, the required quantity of treating solution has been supplied from the nozzle 17 remaining still to areas around the spin center of wafer W liable to an uneven application of the treating solution. The spinning speed of the wafer W at 100 rpm to 300 rpm produces an effect of reducing the action of centrifugal force to spread the treating solution applied around the spin center of wafer W.

Upon lapse of about 0.1 to 1 second in this state (Step S17), the nozzle 17 is moved from the position, marked (B) in FIGS. 15 and 16, opposed to the spin center of wafer W toward the position, marked (C) in FIGS. 15 and 16, opposed to the edge of wafer W (Step S18). At this time, the spin chuck 13 is driven to spin the wafer at the first spinning speed again (Step S19). In this state also, the spinning speed of wafer W is approximately 100 rpm to 500 rpm, whereby the treating solution is supplied properly without consuming a large quantity of treating solution.

When the nozzle 17 reaches the position, marked (C) in FIGS. 15 and 16, opposed to the edge of wafer W on the spin chuck 13 (Step S20), the switch valve 28 is closed to stop delivery of the treating solution from the nozzle 17 (Step S21), and the movement of the nozzle 17 also is stopped (Step S22).

Then, the spin chuck 13 is driven to spin the wafer W at a second spinning speed in the plane parallel to the principal plane (Step S23). Preferably, the second spinning speed is in the order of 1,000 rpm to 3,500 rpm. As a result, the treating solution supplied is spread over the surface of wafer W by centrifugal force, to form a uniform film of the treating solution on the surface of wafer W.

Upon lapse of a fixed time (Step S24) with a uniform film of treating solution formed on the surface of wafer W, the spin chuck 13 is stopped spinning (Step S25) to end the treating solution applying operation.

In the above embodiment, the nozzle 17 is moved from the position opposed to an edge of wafer W on the spin chuck 13, marked (A) in FIGS. 15 and 16, to the position opposed to the spin center of wafer W, marked (B) in FIGS. 15 and 16, and further to the position opposed to an opposite edge of wafer W, marked (C) in FIGS. 15 and 16. However, the nozzle 17 may be moved from the position opposed to an edge of wafer W on the spin chuck 13, marked (A) in FIGS. 15 and 16, to the position opposed to the spin center of wafer W, marked (B) in FIGS. 15 and 16, and thereafter back to the position opposed to the edge of wafer W on the spin chuck 13, marked (A) in FIGS. 15 and 16.

In each of the foregoing embodiments, the nozzle 17 is moved linearly and diametrically of wafer W spinning with the spin chuck 13. Instead, the arm 16 may be adapted swingable about a vertical axis to swing the nozzle 17 along an arcuate track.

In the foregoing embodiments, the nozzle 17 is moved between the position opposed to an edge of spinning wafer W, marked (A) in FIGS. 1 and 2, and the position opposed to the spin center of spinning wafer W, marked (B) in FIGS. 1 and 2. The range of movement of the nozzle 17 is not limited to the above. For example, the position (A) may be replaced by a position inwardly of the position opposed to an edge of spinning wafer W.

In the foregoing embodiments, the treating solution has been described as having its line widths gradually enlarging from edge to center of wafer W as shown in FIG. 19. However, this invention is not limited to such embodiments. For example, the treating solution may be supplied in a constant quantity to areas away from the spin center of wafer W, and in an increased quantity only to areas adjacent the spin center of wafer W. As long as the treating solution is supplied in an increased quantity to areas adjacent the spin center of wafer W, the increased quantity of treating solution adjacent the spin center of wafer W effectively eliminates any omission or unevenness of the solution around the spin center of wafer W and spreads the solution over the entire surface of wafer W in the film thickness adjusting step.

In the foregoing embodiments, the control unit 30 has been described as controlling rotating speed of the motor 11 and moving speed of the moving device 45 such that, in one spin of the wafer W supported by the spin chuck 13, the nozzle 17 is moved by the amount L+P (FIG. 5) in the direction perpendicular to the direction tangential to the circle about the spin center of wafer W. However, this invention is not limited to such embodiments. For example, the control unit 30 may control rotating speed of the motor 11 and moving speed of the moving device 45 such that, in one spin of the wafer W, the nozzle 17 is moved at least by the amount L+P or at most by the amount L+P in the direction perpendicular to the direction tangential to the circle about the spin center of wafer W.

In the foregoing embodiments, the treating solution supplied from each treating solution outlet 21 of the nozzle 17, preferably, has a line width substantially larger than the diameter of each outlet 21. Suppose the treating solution supplied from each treating solution outlet 21 of the nozzle 17 has a line width equal to the diameter of each outlet 21, the spacing between the lines must be reduced to a certain extent to cover the entire surface of wafer W although the treating solution is supplied in an increased quantity around the center of wafer W. Then, the spinning speed of wafer W and the moving speed of nozzle 17 must be increased in order to supply the treating solution all over the wafer W without increasing the overall quantity of treating solution. An increase in the spinning speed of wafer W will scatter a large quantity of treating solution away from the wafer W. By supplying the treating solution from each treating solution outlet 21 of the nozzle 17 in a line width substantially larger than the diameter of each outlet 21, the treating solution may be applied over the entire surface of wafer W efficiently while spinning the wafer W at low speed.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Applications No. 2002-167993 filed in the Japanese Patent Office on Jun. 10, 2002, No. 2002-167994 filed in the Japanese Patent Office on Jun. 10, 2002 and No. 2002-333157 filed in the Japanese Patent Office on Nov. 18, 2002, the entire disclosure of which is incorporated herein by reference.

What is claimed is:

1. A treating solution applying method comprising:
   a substrate spinning step for spinning a substrate in a plane parallel to a principal plane thereof at a first spinning speed of 100 rpm to 500 rpm;
   a first applying step for supplying a treating solution to a surface of the substrate by moving a nozzle from a position opposed to an edge of the substrate in a spin toward a position opposed to a spin center of the substrate while delivering the treating solution from said nozzle;
   a second applying step for supplying the treating solution to the surface of the substrate by stopping said nozzle at the position opposed to the spin center of the substrate in the spin while delivering the treating solution from said nozzle; and
   a film thickness adjusting step for stopping delivery of the treating solution from said nozzle, and spinning the substrate in the plane parallel to the principal plane thereof at a second spinning speed faster than said first spinning speed.

2. A treating solution applying method as defined in claim 1, wherein said nozzle includes a plurality of treating solution outlets arranged in a direction intersecting a direction tangential to a circle about the spin center of the substrate.

3. A treating solution applying method as defined in claim 2, wherein said nozzle is adjustable to vary an angle at which the direction of arrangement of said treating solution outlets intersects the direction tangential to the circle about the spin center of the substrate.

4. A treating solution applying method as defined in claim 1, wherein said nozzle includes a plurality of treating solution outlets arranged at vertices of a polygon.

5. A treating solution applying method as defined in claim 1, wherein said nozzle includes a plurality of treating solution outlets arranged at vertices of a polygon and at a center of a circle linking said vertices.

6. A treating solution applying method as defined in claim 1, wherein said nozzle includes a plurality of treating solution outlets arranged at vertices of a regular hexagon and at a center of a circle linking said vertices.

7. A treating solution applying method as defined in claim 1, wherein, in one spin of the substrate in said first applying step, said nozzle is moved by an amount corresponding to a sum of a length of arrangement of a plurality of outlets on said nozzle in a moving direction of said nozzle and a pitch of said outlets in the moving direction of said nozzle.

8. A treating solution applying method as defined in claim 1, wherein said second spinning speed is 1,000 rpm to 3,500 rpm.

9. A treating solution applying method comprising:

a substrate spinning step for spinning a substrate in a plane parallel to a principal plane thereof at a first spinning speed;

a first applying step for supplying a treating solution to a surface of the substrate by moving a nozzle from a position opposed to an edge of the substrate in a spin toward a position opposed to a spin center of the substrate while delivering the treating solution from said nozzle;

a second applying step for supplying the treating solution to the surface of the substrate by stopping said nozzle at the position opposed to the spin center of the substrate in the spin while delivering the treating solution from said nozzle;

a third applying step for supplying the treating solution to the surface of the substrate by moving said nozzle from the position opposed to the spin center of the substrate in the spin toward a position opposed to an edge of the substrate while delivering the treating solution from said nozzle; and a film thickness adjusting step for stopping delivery of the treating solution from said nozzle, and spinning the substrate in the plane parallel to the principal plane thereof at a second spinning speed faster than said first spinning speed.

10. A treating solution applying method as defined in claim 9, wherein said nozzle includes a plurality of treating solution outlets arranged in a direction intersecting a direction tangential to a circle about the spin center of the substrate.

11. A treating solution applying method as defined in claim 9, wherein said nozzle includes a plurality of treating solution outlets arranged at vertices of a polygon.

12. A treating solution applying method as defined in claim 9, wherein said nozzle includes a plurality of treating solution outlets arranged at vertices of a polygon and at a center of a circle linking said vertices.

13. A treating solution applying method as defined in claim 9, wherein said nozzle includes a plurality of treating solution outlets arranged at vertices of a regular hexagon and at a center of a circle linking said vertices.

14. A treating solution applying method as defined in claim 9, wherein, in one spin of the substrate in said first applying step, said nozzle is moved by an amount corresponding to a sum of a length of arrangement of a plurality of outlets on said nozzle in a moving direction of said nozzle and a pitch of said outlets in the moving direction of said nozzle.

15. A treating solution applying method as defined in claim 9, wherein, in said second applying step, the substrate is spun at a third spinning speed slower than said first spinning speed.

16. A treating solution applying method as defined in claim 15, wherein said third spinning speed is 100 rpm to 300 rpm.

17. A treating solution applying method as defined in claim 9, wherein said first spinning speed is 100 rpm to 500 rpm.

18. A treating solution applying method as defined in claim 9, wherein said second spinning speed is 1,000 rpm to 3,500 rpm.

* * * * *